United States Patent [19]
Hamza

[11] Patent Number: 5,818,270
[45] Date of Patent: Oct. 6, 1998

[54] TEMPERATURE INDEPENDENT, WIDE RANGE FREQUENCY CLOCK MULTIPLIER

[75] Inventor: Ridha M. Hamza, Minneapolis, Minn.

[73] Assignee: Honeywell, Inc., Minneapolis, Minn.

[21] Appl. No.: 808,495

[22] Filed: Feb. 27, 1997

[51] Int. Cl.$^6$ .................................................. H03H 11/26
[52] U.S. Cl. ........................... 327/116; 327/175; 327/276; 327/299
[58] Field of Search ................................... 327/116, 299, 327/175, 276

[56] References Cited

U.S. PATENT DOCUMENTS

| | | | |
|---|---|---|---|
| 4,877,974 | 10/1989 | Kawai et al. ............................ | 327/116 |
| 5,530,387 | 6/1996 | Kim ........................................ | 327/116 |
| 5,684,418 | 11/1997 | Yanagiuchi .............................. | 327/298 |

OTHER PUBLICATIONS

Gardner. Charge–pump Phase Locked Loops, IEEE Transactions on Communications, vol. 28, No. 11, pp. 1849–1858, Nov. 1980.

Reynolds. A 320 MHz CMOS Triple 8 Bit DAC with On–Chip PLL and Hardware Cursor, IEEE Journal of Solid–State Circuits, vol. 29, No. 12, pp. 1545–1551, Dec. 1994.

Igura, Suzuki, Nakyama, Izumikawa, Normura, Goto, Inoue, Abiko, Okabe, Ono, Yamashina, Yamada. "A 1.5% jitter PLL Clock Generation System for a 500–MHz RISC Processor", Proceedings of the IEEE 1994 Custom Integrated Circuits Conference, pp. 25.1.1–25.1.4, May 1994.

Goto, Yamashina, Inoue, Shih, Koseki, Horiuchi, Hamatake, Kumagai, Enomotor, Yamada. "A programmable clock generator with 50 to 350 MHz lock range for video signal processing". Proceedings of the IEEE 1993 Custom Integrated Circuits Conference, pp. 4.4.1–4.4.4, May 1993.

Jeong, Borriello, Hodges, Katz. "Design of PLL based clock generation circuits", IEEE Journal of Solid–State Circuits, vol. Sc–22, No. 2, pp. 255–261, Apr. 1987.

Wouldsma, Noteboom. "The Modular Design of Clock Generator Circuits in a CMOS Building Block System", IEEE Journal of Solid–State Circuits, vol. Sc–20, No. 3, pp. 770–774, Jun. 1985.

Gardner. "Phase Accuracy of Charge Pump PLL's", IEEE Transactions on Communications, vol. 30, No. 10, pp. 2363–1363, Oct. 1982.

*Primary Examiner*—Margaret Rose Wambach
*Attorney, Agent, or Firm*—John G. Shudy, Jr.

[57] ABSTRACT

A delay locked loop, temperature independent, wide range frequency clock multiplier that outputs a clock signal that has a frequency that is a multiple of the frequency of the input clock signal. The multiplier does not use any phase-locked circuitry. It has adjustable delay lines or cells that are cascaded and have outputs to a multiple input exclusive OR gate. The exclusive OR gate outputs the multiplied frequency signal. A delay controller outputs a signal to each of the delay lines or cells for setting the amount of delay in each line or cell. A delay monitor has inputs from the exclusive OR gate output and the delay controller output. The delay monitor outputs signals to the delay controller which has a phase differentiator. The delay controller output is such to maintain a particular duty cycle on the waveform of the multiplied frequency signal output from the exclusive OR gate.

12 Claims, 9 Drawing Sheets

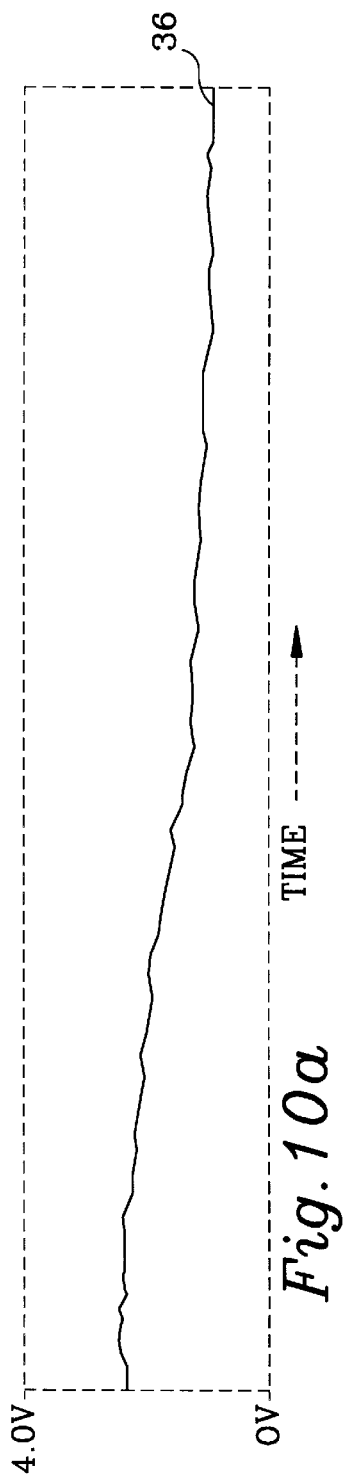
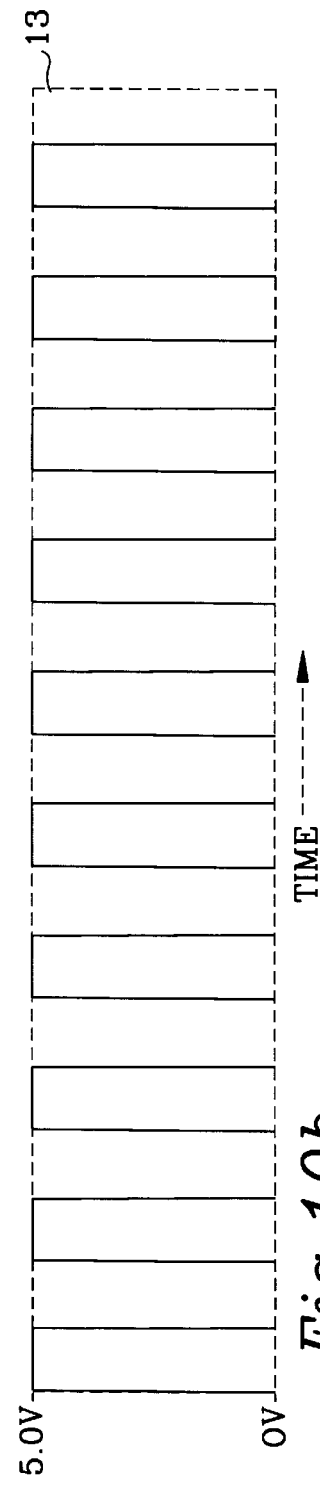
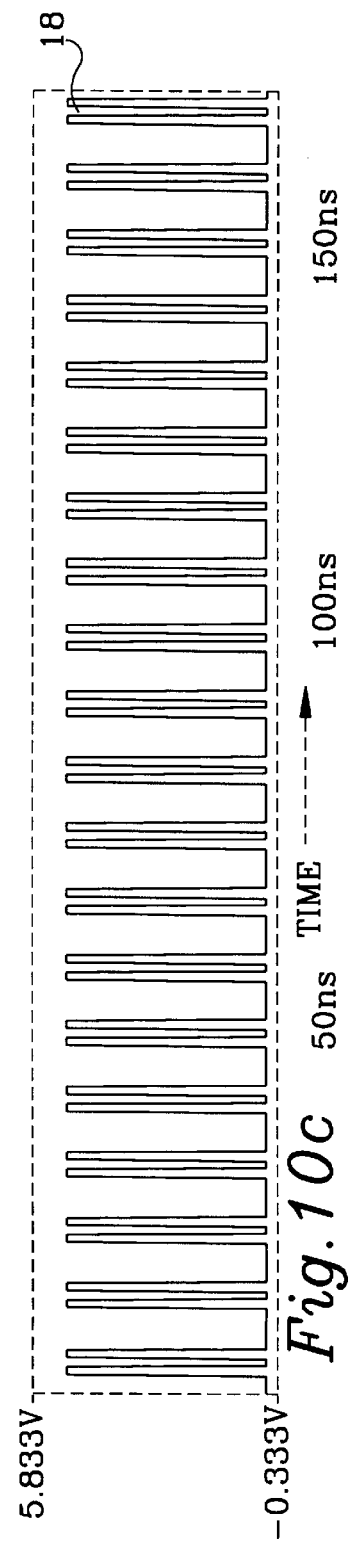
Fig.10a
Fig.10b
Fig.10c

TEMPERATURE INDEPENDENT, WIDE RANGE FREQUENCY CLOCK MULTIPLIER

BACKGROUND OF THE INVENTION

The invention pertains to clocks and particularly to clock frequency multipliers. More particularly, the invention pertains to wide range frequency clock multipliers that do not use phase-locked loops.

There are clock frequency multipliers in the related art that used phase-locked loops. In those multipliers, there is neither control nor provision to prevent inter-chip skew. The circuits require larger than desired chip areas. They have a very limited range of frequency variation. The circuitry of the related art multipliers also have instability problems.

SUMMARY OF THE INVENTION

The present invention is a clock multiplication system which is temperature independent and self-consistent. It multiplies the input clock frequency by outputting an N multiple frequency where N is typically an integer determined by the extensiveness of the multiplier design. This system can vary over a much wider range of frequencies than like systems of the related art. The present invention does not use phase-locked loop circuitry, that have inherent instability problems. The invention uses new delay-locked loop (DLL) circuitry which has no such instability problems. The invention involves clock generation circuitry which has self-calibrated tapped delay lines used to generate different clock signals, which are then passed through logical function to produce an integral-multiple of an input clock. The system may be fabricated on 0.8 micron CMOS triple layer integrated circuits using MOSIS CMOS process. The circuits of this process technology can operate at 3.3 or 5.0 volts. For example, a four-times clock multiplier circuit has an output range of up to 370 MHz with almost zero-clock skew. The clock multiplier circuitry is simple, temperature independent, uses a very small number of transistors and hence requires little area and power dissipation.

Today's semiconductor processing requires a very high speed of operation to conduct all the functionality elements and meet electronics system requirements. For example, fast CMOS digital-to-analog converters (DAC), and a demultiplexer/driver chip, which are essential to high-resolution displays, typically run at different high clock rates. As display resolutions increase, the required update rate increases and can be as high 400 MHz. Thus, it is necessary to have a variable clock generation system. To fully exploit the increase in computational power of a chip, it is important to have a clock generation system that can handle such high speeds and can vary with an external reference clock. Moreover, the integration of the clock multiplication into a system chip, rather then using a separate high frequency crystal, has proved to be beneficial. The amount of electromagnetic-interference radiation is diminished from the overall system when the high frequency clock is removed from the printed system circuit board.

In the art, there have been accurate clock generators using phase-locked-loop (PLL). Reasons for their use include extended tracking range, and low cost availability in integrated circuit chips. But in all of those cases, there is either no control or lack of provision against any inter-chip skew. There is not smooth transition from low to high frequencies in these types of clock generators. In some cases, stages are pre-selected to achieve a higher range of frequency operation and some parts of the circuitry are turned on/off by external switches in order to move between these stages.

The present inventor is a simple clock generation and multiplication system which is temperature independent, very self-consistent, and varies with the frequency input. In contrast to the state-of-the-art circuitry for clock generators, the present invention design does not contain a PLL circuit. The present clock is based on self calibrating delays fed from the filtered output of a charge-pump to control the delays. The system architecture is implemented as a series of common circuitry blocks, looped together to converge to a fixed delay and lock on it. The method is termed a delay-locked-loop (DLL) based approach. The design is implemented in 0.8 micron n-well CMOS technology. Although the development and design of the present circuitry are conducted to produce any integral-multiple of an input clock, a four-times clock multiplier is described here.

BRIEF DESCRIPTION OF THE DRAWINGS

FIGS. 10a, 10b and 10c show waveforms of the control voltage, the input clock and the output clock, respectively.

DESCRIPTION OF THE PREFERRED EMBODIMENTS

Figure 1:
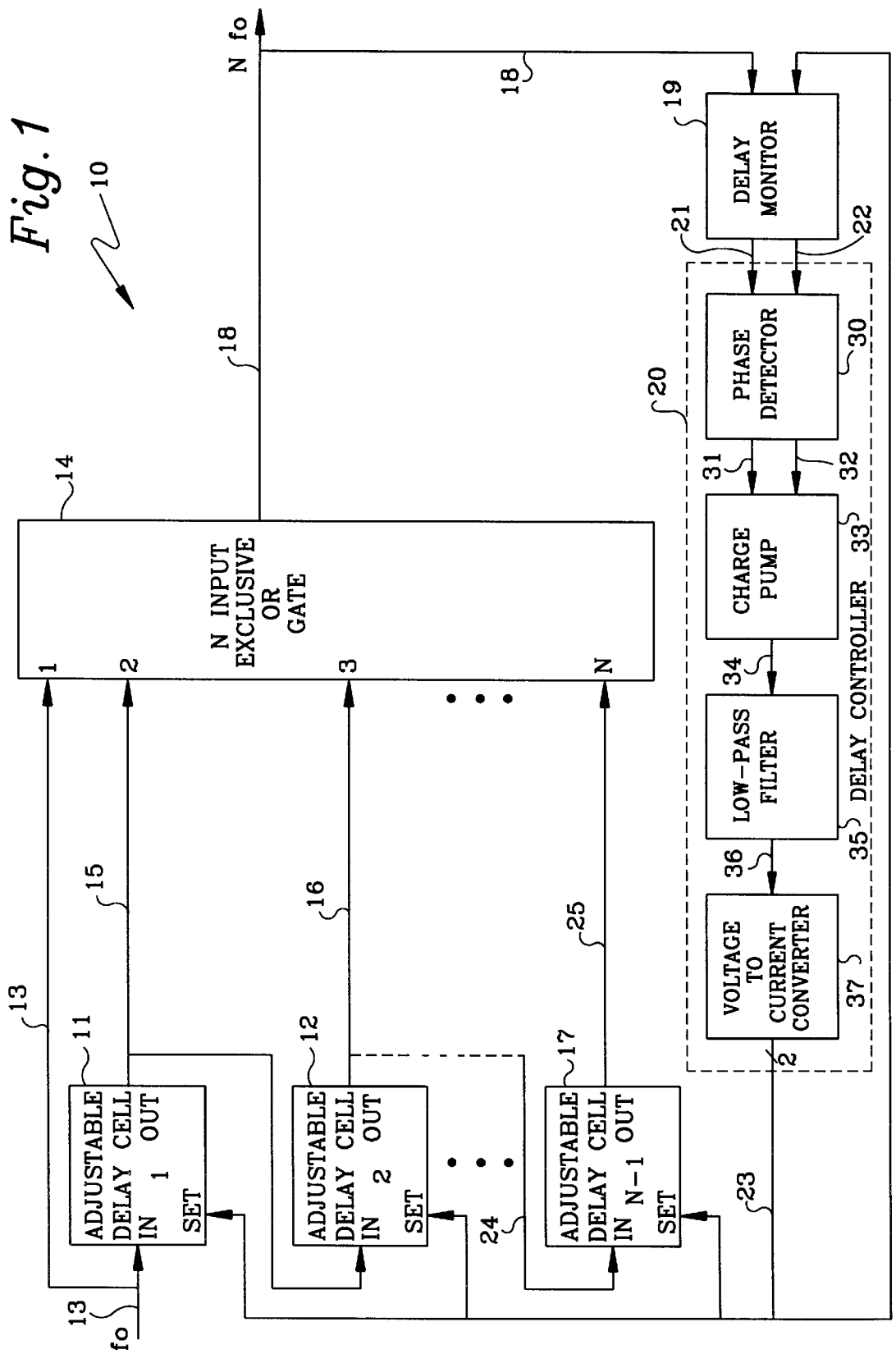
FIG. 1 is a block diagram of a wide range frequency clock multiplier.

FIG. 1 is a block diagram of a clock multiplier 10. It is based on a set of self-calibrated tapped delay lines 15, 16, 25, with outputs originating from an input waveform 13 at a frequency $f_o$, which are then passed through a logical function 14 to generate an output frequency (f=N $f_o$). Clock multiplier 10 has N−1 concatenated delay cells 11, 12, 17, a logical multiplication function 14, a delay monitor 19, a phase detector 30, a charge pump 33, a low pass filter 35 and a voltage-to-current converter 37. Clock multiplier functions include operation as a feedback control system, in such, a control current 23 that is an output of a delay controller 20, converges to a steady-state level, resulting in a loop locked on a fixed delay. Thus, the multiplier is based on a delay-locked-loop (DLL) approach.

Logical multiplier 14 is implemented as an exclusive OR function. A series connection of delay cells 11, 12, 17, forms tapped delay lines whose outputs are used to generate n-phase non-overlapping clock lines 15, 16, 25. These lines are then used as inputs to function block 14 to derive the multiplication.

Figure 2:
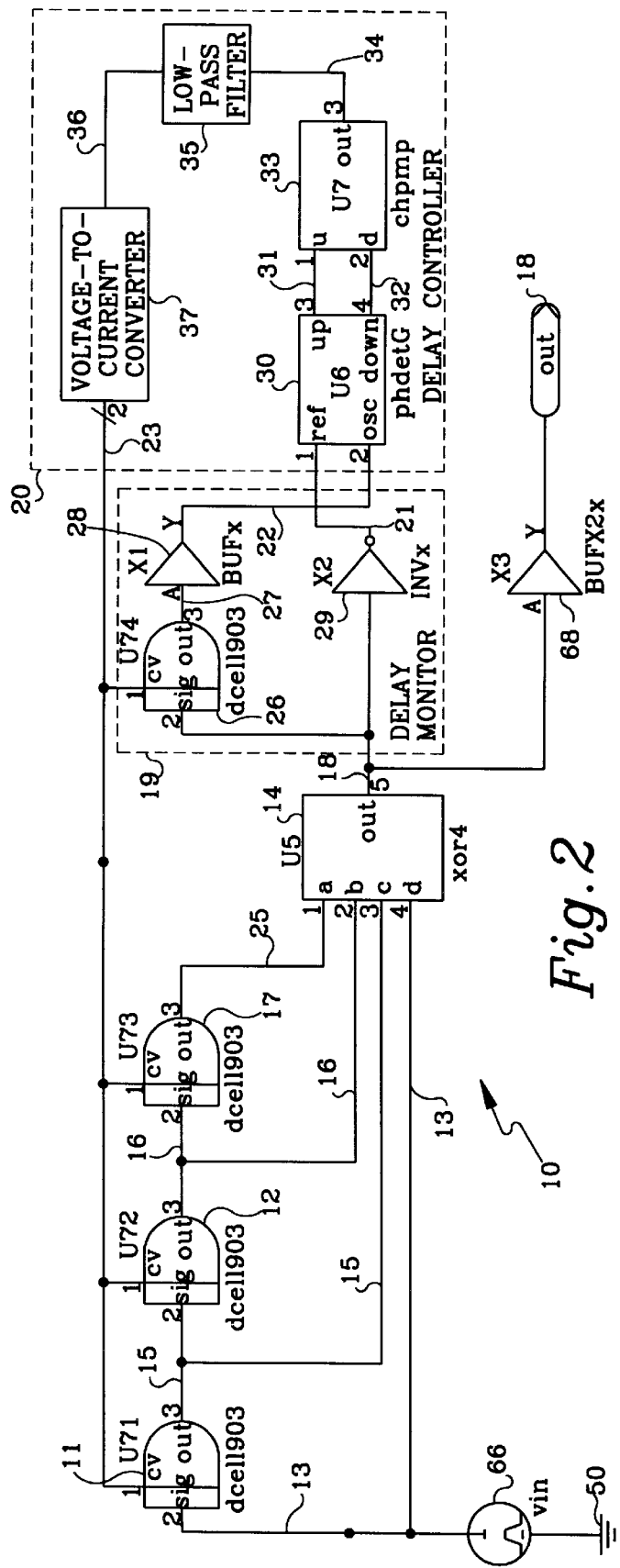
FIG. 2 is a schematic of a four-times frequency clock multiplier.

Frequency multiplier 10 is shown in FIGS. 1 and 2. An N-times multiplier is shown in FIG. 1 and a four-times multiplier is shown in FIG. 2. An input clock signal 13 to multiplier 10, is input to an adjustable delay cell 11, which delays the clock signal, and to a multiple input exclusive OR gate 14, shown in FIG. 3. Output 15 of first delay cell 11 is input to another delay cell 12. Output 16 of delay cell 12 is a twice delayed clock signal which is input to exclusive OR gate 14 and possibly to still another (N−1) adjustable delay cell 17 depending on how many times one wants to multiply the clock frequency of signal 13. Delay cell 17 is the last cell with an input 24 from a preceding delay cell. Output 25 from the N−1 delay cell 17 goes to N input of gate 14. If the number times N of a clock frequency is desired, then multiplier 14 will have N−1 adjustable delay cells and an exclusive OR gate 14 having N inputs. The delays of the cells 11, 12, 17 are the same with one another for a particular clock frequency of signal 13 but the delays are varied when the input clock frequency of signal 23 changes. An output 18 of exclusive OR gate 14 is the multiplied frequency. In order to set the proper delays for the delay cells 11, 12, 17, signal 18 having the output frequency is used as a feedback signal 18 to indirectly set the delays of cells 11, 12, 17. Output 18 is fed to a delay monitor 19 that has outputs 21, 22 to a delay controller 20. An output 23 of delay controller 20 goes to delay cells 11, 12, 17 to set their delays. Signal 23 is also fed back to delay monitor 19. Delay monitor 19 is shown with some detail in FIG. 2. Monitor 19 has an adjustable delay cell 26 having signal 18 from gate 14 as an input, and delay control signal 23 from delay controller 20 as another input. Output signal 27 is a delayed signal 14 having a delay of cell 26 the same as the delays of cells 11, 12 and 17. Signal 26 goes through a buffer 28 and becomes output 22 from delay monitor 19. Signal 18 as an input to monitor 19, goes through an inverter 29 which outputs signal 21 as output 21 from monitor 19.

Signals 21 and 22 are input to phase detector 30. Detector 30 indicates the direction and magnitude of the phase relationship between signal 18 and delay controller feedback signal 23. Output signals 31 and 32 indicate the phase differences between signals 21 and 22.

Signals 31 and 32 go to charge pump 33 which converts the information into a single voltage signal 34, which goes to low-pass filter 35, which smoothes out signal 34 into a delay control voltage 36, which is converted into a delay control current signal 23 by a voltage-to-current converter 37. Signal 23 is in a form of a dual signal for a push-pull delay setting input of respective adjustable delay cells 11, 12, 17 and 26. An alternate configuration of multiplier design 10 may incorporate a voltage-to-current converter 37 within each of the delay cells 11, 12, 17 and 26, instead of within delay controller 20.

Figure 4:
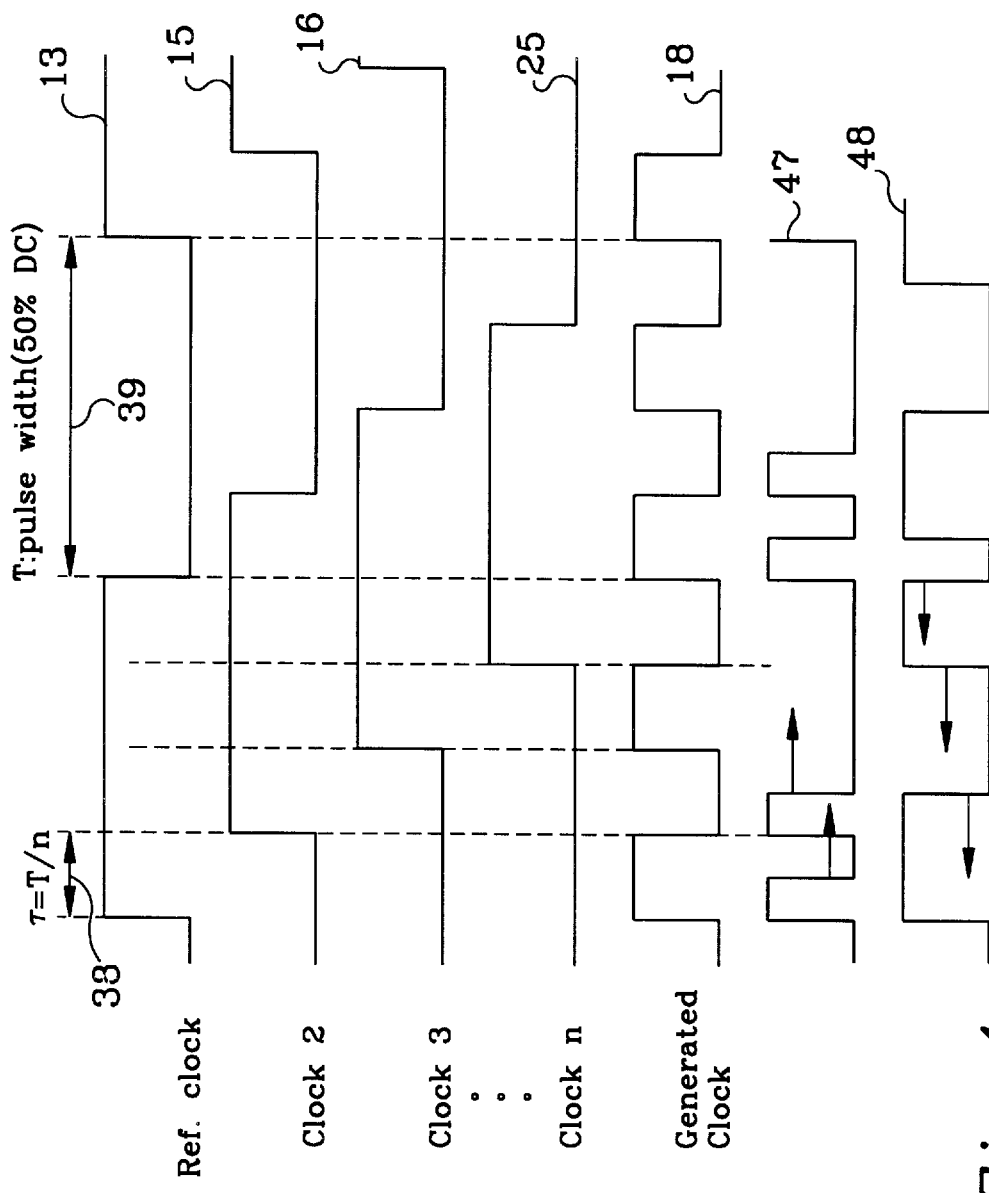
FIG. 4 is a diagram of various clock signals of the frequency clock multiplier.
Figure 5:
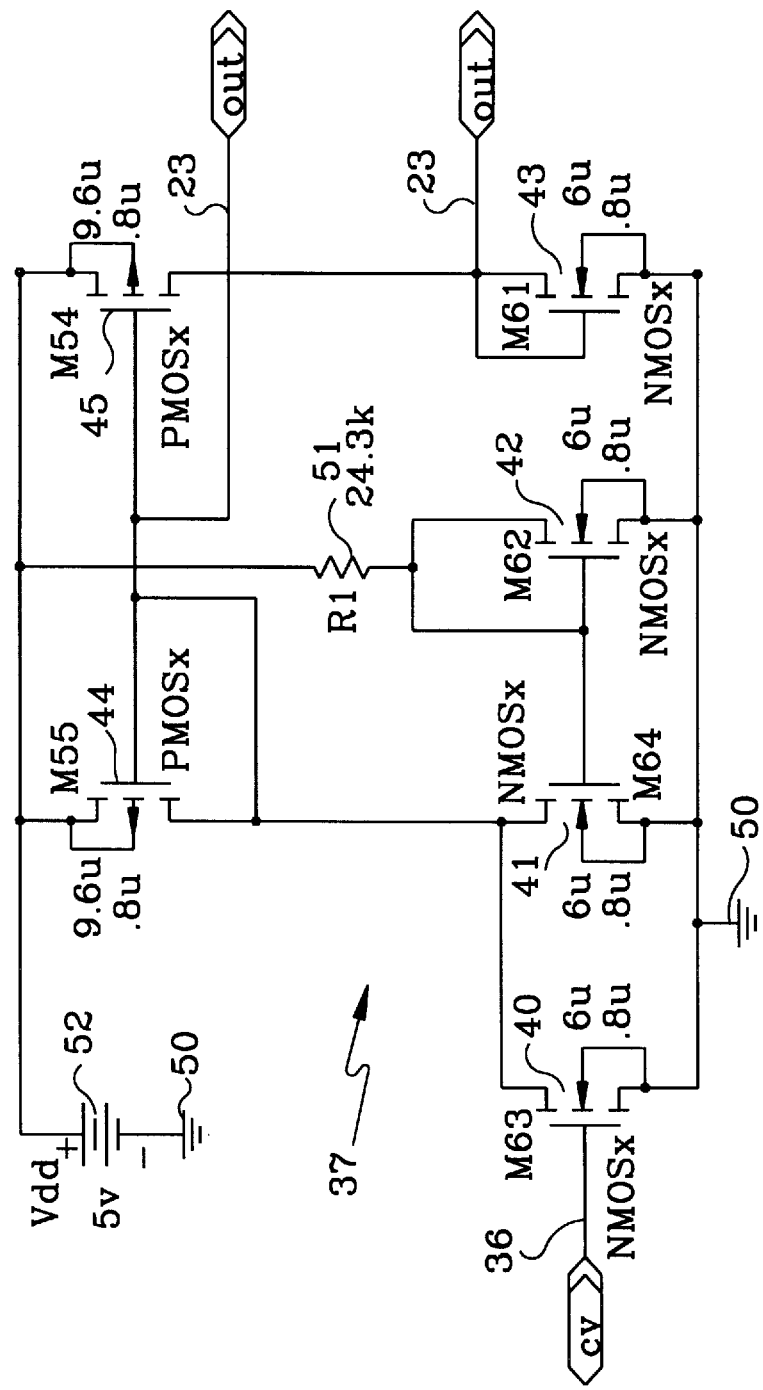
FIG. 5 is a schematic of a current-to-voltage converter.

A clock derivation scheme is depicted in FIG. 4. Output waveforms 15, 16, 25 of each of the delay cells 11, 12, 17, respectively, are best set at a 50 percent duty cycle. (To compensate for the asymmetry due to the difference in mobility of holes and electrons, a width ratio is selected (e.g., 1.6) and maintained in all the clock multiplier circuitry of an integrated circuit structure.) For instance, a four-times clock multiplier 10, output 18 is derived by exclusive OR-ing the outputs 15, 16, 25 of three delay cells 11, 12, 17 along with original waveform 13. To ensure proper overlapping, each delay cell must produce a ratio 1/N of a clock phase delay to high time (pulse width) throughout the entire operating frequency regardless of the variations of process and temperature. Delay 38 (i.e., τ=T/N where T is pulse width 39 with a 50 percent duty cycle) of each cell 11, 12, 17 is determined by the amount of current 23 supplied through current source 37 which is controlled by the DLL control voltage 36, as shown in FIG. 5. Circuit 37 takes control voltage 36 and converts it to a current 23 for delay elements. Circuit 37 consists of opposite facing current mirrors which give a very good power supply rejection of noise. Circuit 37 operation is defined by the amount of control voltage 36 across the NMOS gates 40, 41, 42, 43, which will be pushed to the triode region. PMOS gates 44, 45 play a role of bias lines for all variable resistive loads in the delay elements 11, 12, 17, 26.

Figure 6:
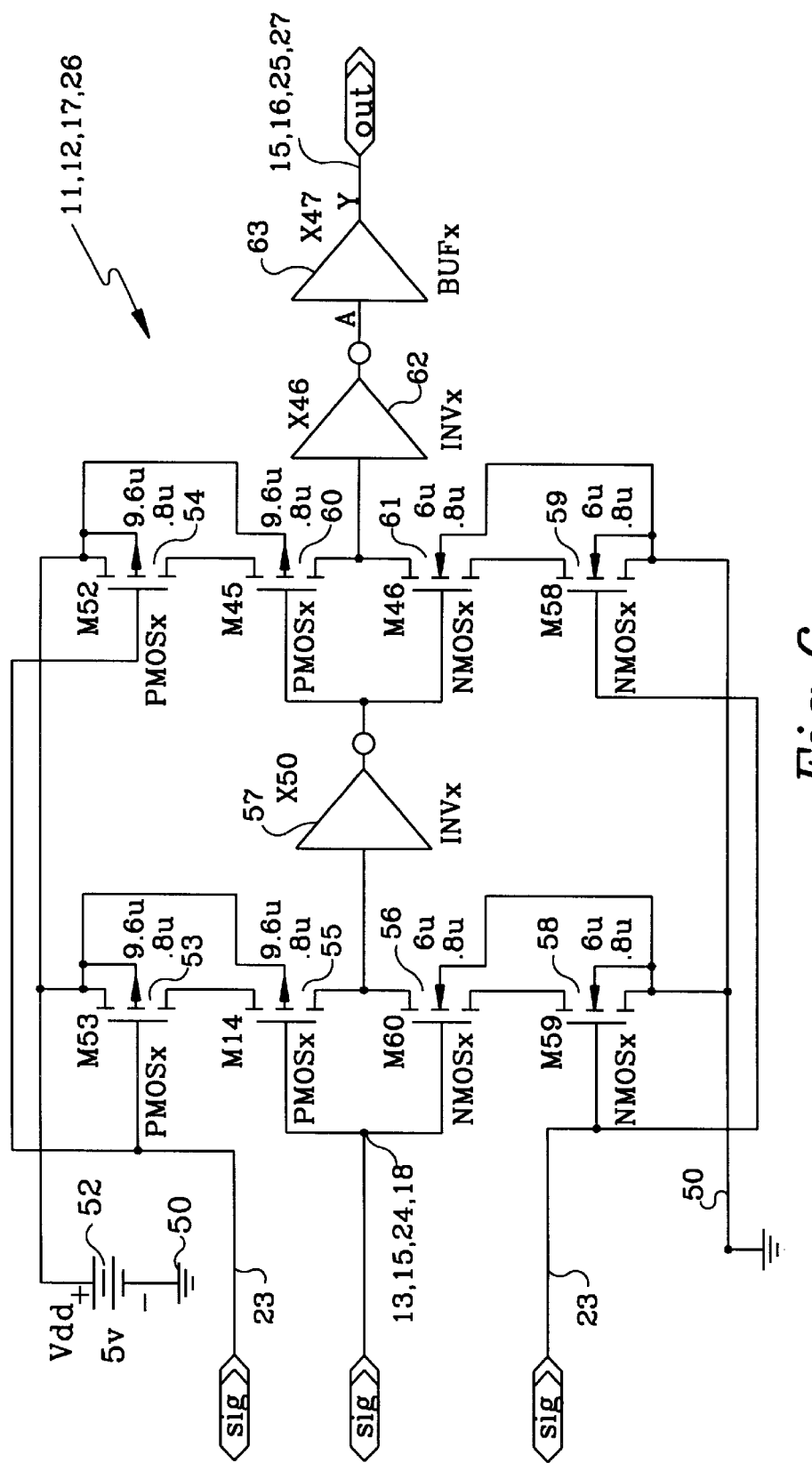
FIG. 6 is a schematic of an adjustable delay line or cell.

In order to feedback the circuitry for system 10 self-calibration, the system design is implemented so that control voltage 36 directly proportional to the resulting waveform at the output of gate 14, and hence to delay amount 38. One way to determine whether delay 38 is an excess or shortage is to examine the duty cycle of output wave-form 18. In a steady state, a 50 percent duty cycle wave-form is expected. Thus, any deviation from 50 percent indicates that further delay adjustments are needed. FIG. 6 presents one alternative of a delay monitor circuit 19 that meets these requirements. The falling edge of the output wave-form 18 is aligned to the rising edge of its one-cell delayed waveform 15 in FIG. 4. The amount of leading/lagging of these edges indicate the amount of excess/shortage current 23 to be supplied to every individual delay cell 11, 12, 17, 26.

Figure 7:
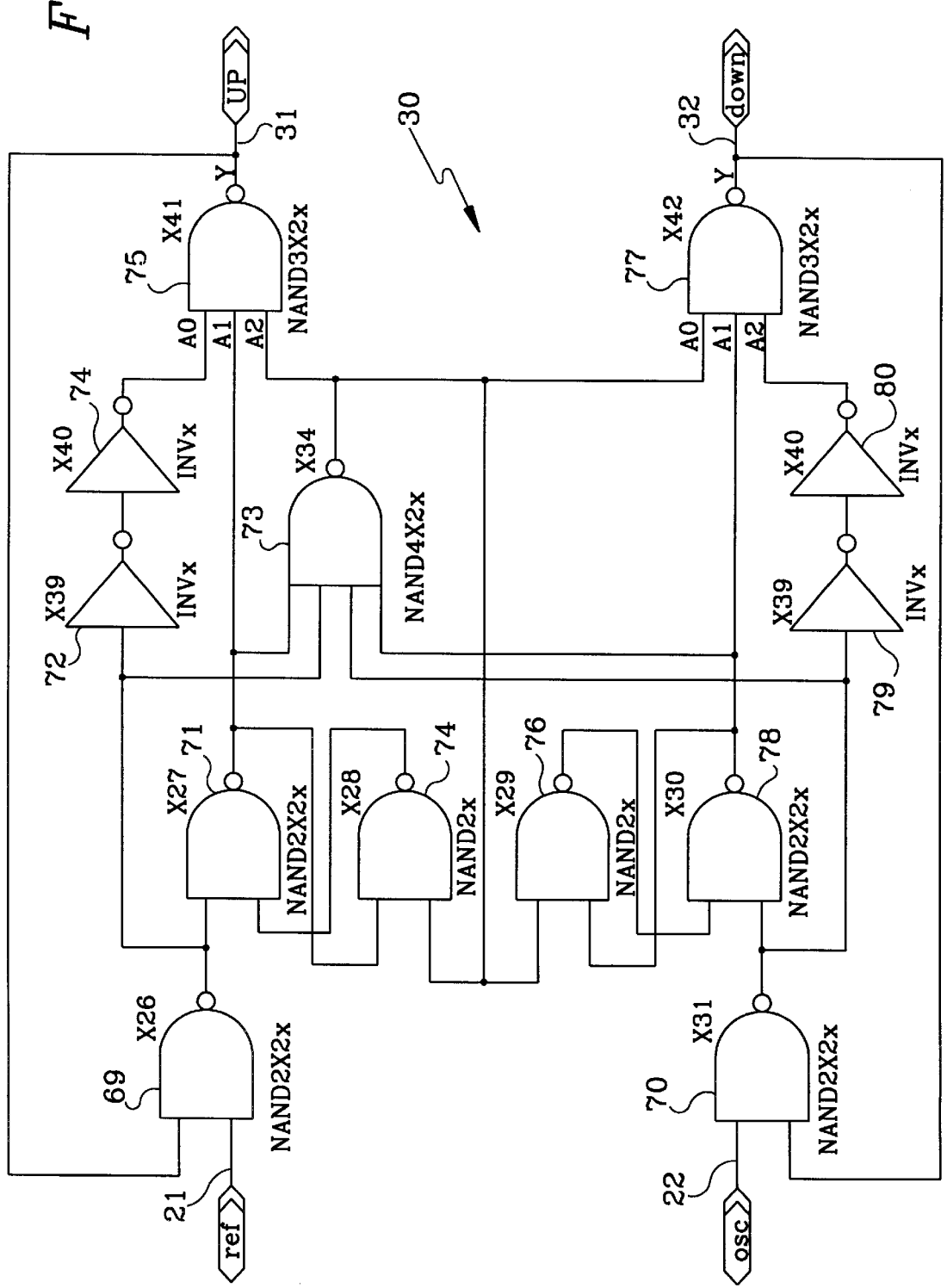
FIG. 7 is a logic diagram of a phase detector.

A phase-frequency detector 30, shown in FIG. 7, is used to measure the phase difference between the rising and falling edge of both wave-forms, outputs 21 and 22 of delay monitor 19. Outputs 21 and 22 are named to indicate whether the duty cycle is less or more then 50 percent. When the falling edge of output clock 18 leads the rising edge of one-cell delayed output clock 15, a 'more' signal is activated to a low level until the rising edge of clock 15 arrives. Similarly, a 'less' signal is activated to a low level when the falling edge of output clock 18 lags clock 15. Both signals are deactivated to high level when they are in phase (i.e., waveform symmetry is achieved). The latter case is a delay loop-locked state.

Figure 8:
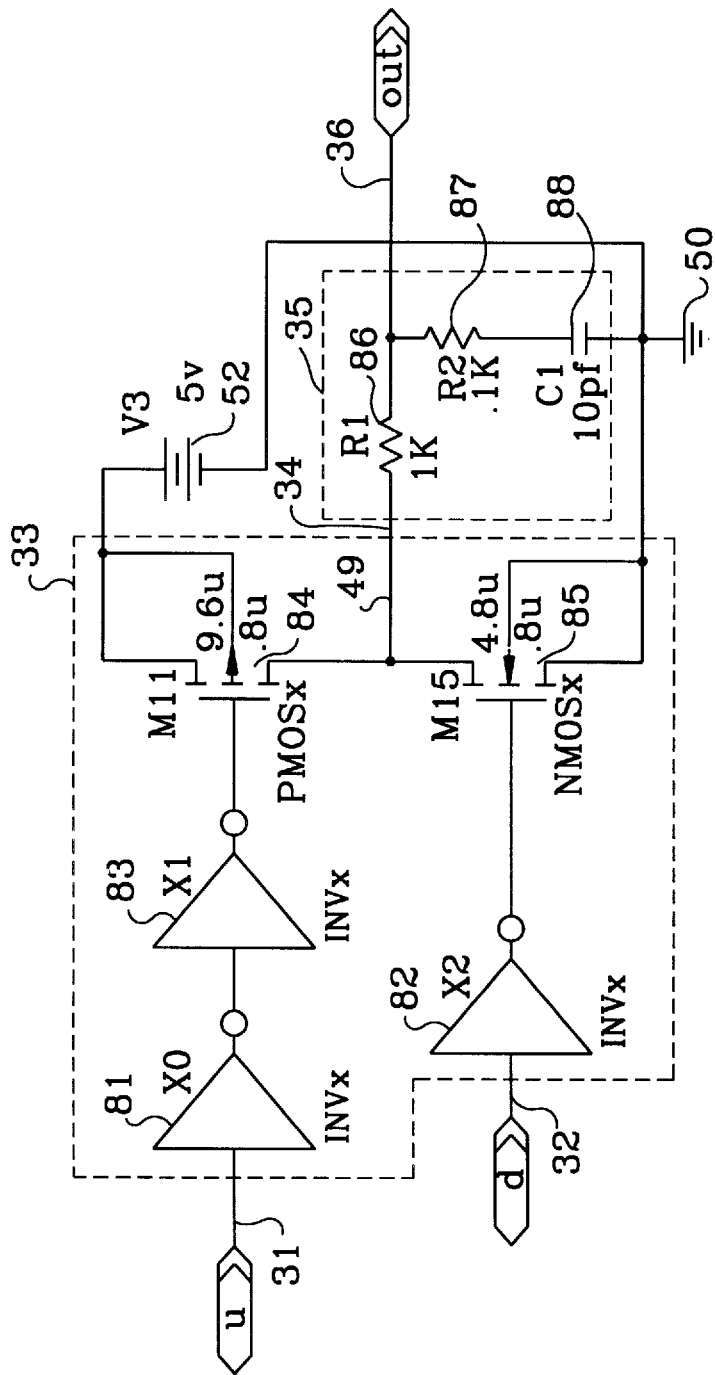
FIG. 8 is a schematic of a charge pump and a low-pass filter.

Phase detector 30 is accompanied with a charge pump 33 to convert the timed logical levels into analog quantities for controlling delay elements 11, 12, 17, 26. A simple realization of charge pump 33 is shown in FIG. 8. On each cycle of operation, charge pump 33 delivers a pump current to the low-pass filter 35 whenever phase detector 30 detects a lagging phase. An implementation of low-pass filter 35 is also shown in FIG. 8. The amount of charge 49 transferred to low-pass filter 35 is directly related to the phase difference detected by phase detector 30. No charge 49 will be transferred when no-phase error is detected. A low-pass filter 35 is added to the output of charge pump 33, mainly to reduce the significant ripple.

Figure 9:
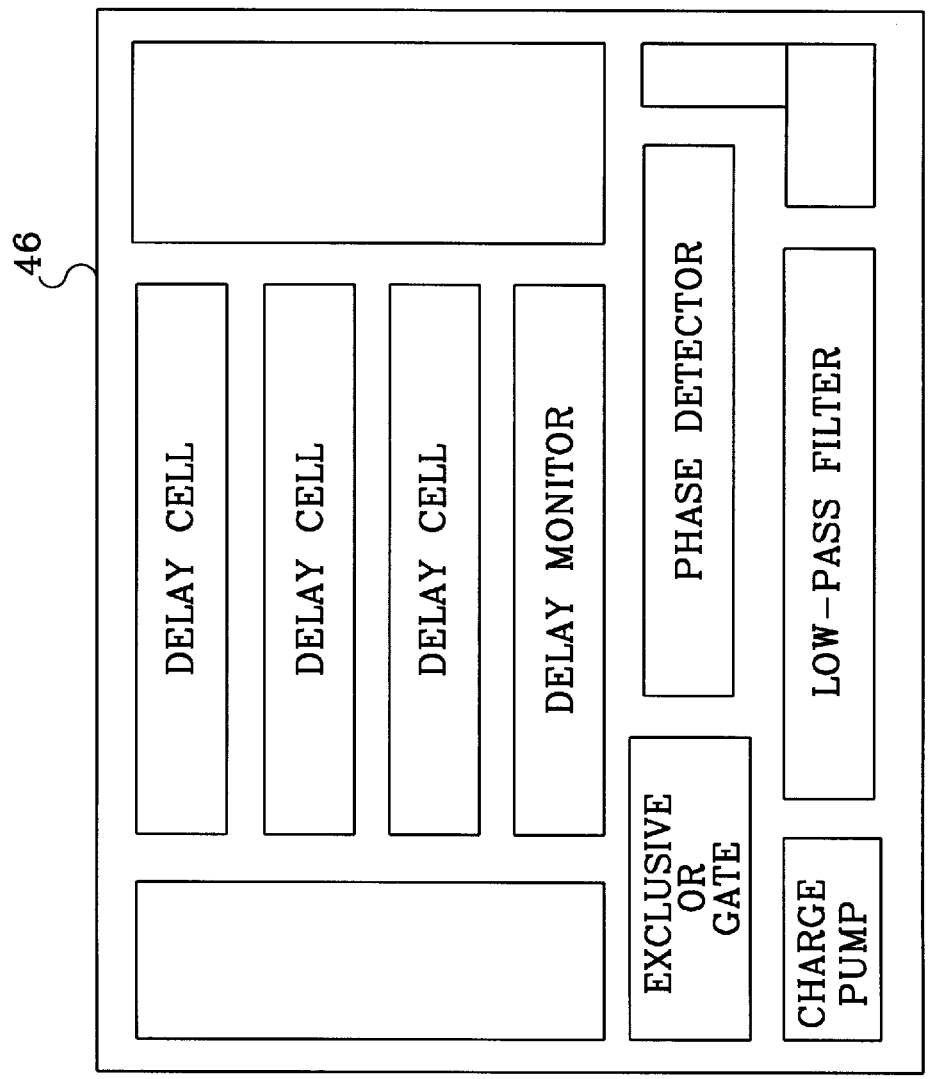
FIG. 9 shows a layout of a clock frequency multiplier on an integrated circuit.

FIG. 9 shows a self-calibrated control multiplier 10 layout on an integrated circuit 46.

FIGS. 10a, 10b and 10c illustrate waveforms measured under normal conditions in which input clock frequency 13 was 60 MHz in FIG. 10b. The initial operation started with an excess delay amount and thus system 10 needed to be adjusted to a lower range. FIG. 10a shows the drop in control voltage 36 while clock multiplier 10 was searching for the appropriate delay 38 amount. There was only 75 nanoseconds (ns) before system clock 10 converged to the steady-state operation. The 240 MHz output clock 18 is illustrated in FIG. 10c. The first 75 ns of operation need to be disregarded since they correspond to the self-calibration period of clock multiplier 10. Simulations results have shown that temperature and process variation do not affect system 10 operation.

Figure 3:
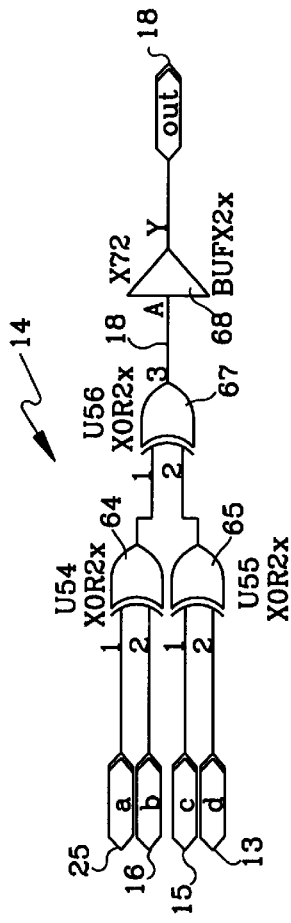
FIG. 3 is a logic diagram of a four-input exclusive OR gate.

The components noted in FIGS. 2, 3, 5, 6, 7 and 8 are of MOSIS integrated circuit technology. FIG. 3 is a schematic of exclusive OR gate 14. The first input of two input exclusive OR gate 64 is connected to signal 25 of the output of delay cell 17. The second input of gate 64 is connected to signal 16 of the output of delay cell 12. The first input of two input exclusive OR gate 65 is connected to signal 15 of the output of delay cell 11. The second input of gate 65 is connected to signal 13 of clock 66. The output of gate 64 goes to the first input of a two input exclusive OR gate 67. The output of gate 65 goes to the second input of gate 67.

The output of gate 67 goes to an input of buffer 68. The output of buffer 68 is signal 18 of the output of input exclusive OR gate 14.

FIG. 5 is a detailed schematic of voltage-to-current converter 37 which converts delay control voltage 35 from charge pump 33 via low-pass filter 35, to delay control current 23 which goes to delay set inputs of delay cells 11, 12, 17, 26. Input 36 goes to the gate of an N-channel field effect transistor (FET) 40. The source of FET 40 is connected to ground reference 50. The drain of FET 40 is connected to the drain of N-channel FET 41 and the drain of P-channel FET 44. The source of FET 41 is connected to reference 50. The gates of FET 41 and N-channel FET 42 are connected to resistor 51. Resistor 51 has a value of 24.3 thousand ohms. The other terminal of resistor 51 is connected to a five volt source 52. The drain of FET 42 is connected to the gate of FET 42. The source of FET 42 is connected to reference 50. The gate of N-channel FET 43 is connected to the drain of FET 43. The source of FET 43 is connected to reference 50. The drain of FET 43 is connected to output 23 and to the drain of P-channel FET 45. The source of FET 45 is connected to voltage source 52. The gate of FET 45 is connected to a second output 23 and to the gate and drain of P-channel FET 44. The source of FET 44 is connected to voltage source 52.

FIG. 6 is a schematic of a delay cell which represents those of cells 11, 12, 17 and 26. Signal input 23 is connected to the gates of P-channel FETs 53 and 54. The sources of FETs 53 and 54 are connected to voltage source 52. The drain of FET 53 is connected to the source of P-channel FET 55. The drain of FET 55 is connected to the drain of N-channel FET 56. The gates of FETs 55 and 56 are connected to signal input 13, 15, 24, 18. The drains of FETs 55 and 56 are connected to an input of inverter 57. The source of FET 56 is connected to the drain of N-channel FET 58. The gates of N-channel FETs 58 and 59 are connected to the second signal input 23. The sources of FETs 58 and 59 are connected to ground reference 50. The drain of FET 54 is connected to the source of P-channel FET 60. The drain of FET 60 is connected to the drain of N-channel FET 61. The source of FET 61 is connected to the drain of FET 59. The gates of FETs 60 and 61 are connected to the output of inverter 57. The drains of FETs 60 and 61 are connected to the input of inverter 62. The output of inverter 62 is connected to the input of buffer 63. The output of buffer 63 correspond to outputs 15, 16, 25 and 27 of delay cells 11, 12, 17 and 26, respectively.

FIG. 7 is a schematic of phase detector 30. Signal 21 from delay monitor 19 goes to a first input of NAND gate 69. Signal 22 from delay monitor 19 goes to a first input of two input NAND gate 70. The output of gate 69 goes to a first input of a two input NAND gate 71, to an input of inverter 72 and to a first input of a four input NAND gate 73. The output of inverter 72 goes to an input of inverter 74. The output of inverter 74 goes to a first input of a three input NAND gate 75. The output of gate 75 goes to the second input of gate 69, and is output signal 31 to charge pump 33. The output of gate 71 goes to the second input of gate 75, the second input of gate 73 and the first input of a two input NAND gate 74. The output of gate 74 goes to the second input of gate 71. The output of gate 73 goes to the third input of gate 75, the second input of gate 74, the first input of a two input NAND gate 76, and to a first input of a three input NAND gate 77. The output of gate 76 goes to the first input of a two input NAND gate 78. The output of gate 78 goes to the second input of gate 76, the third input of gate 73 and the second input of gate 77. The output of gate 70 goes to the second input of gate 78, the fourth input of gate 73 and to an input of inverter 79. The output of inverter 79 goes to the input of inverter 80. The output of inverter 80 goes to the third input of gate 77. The output of gate 77 goes to the second input of gate 70, and is output signal 32 to charge pump 33.

FIG. 8 is a schematic of charge pump 33 and low-pass filter 35. Input signal 31 from phase detector 30 goes to the input of inverter 81. Signal 32 from phase detector 30 goes to the input of inverter 82. The output of inverter 81 goes to an input of inverter 83. The output of 83 goes to the gate of P-channel FET 84. The output of inverter 82 goes to the gate of N-channel FET 85. The source of FET 84 is connected to voltage source 52. The source of FET 85 is connected to ground reference 50. The drain of FET 84 is connected to the drain of FET 85. The drains of FETs 84 and 85 are connected to line 49 which provides output signal 34 to low-pass filter 35. Line 49 with signal 34 goes to the first terminal of resistor 86. Resistor 86 is 1000 ohms. The second terminal of resistor 86 is connected to the first terminal of resistor 87. Resistor 87 has a value of 100 ohms. The second terminal of resistor 87 is connected to the first terminal of capacitor 88. Capacitor 88 has a value of 10 picofarads (pf). The second terminal of capacitor 88 is connected to ground reference 50. Terminal 2 of resistor 86 and terminal 1 of resistor 87 are connected to the output terminal of low-pass filter 35 which provides signal 36 to voltage-to-current converter 37.

I claim:

1. A clock frequency multiplier comprising:
   at least one adjustable delay cell having a delay setting input, a clock input and an output;
   a clock terminal;
   an exclusive OR gate having a first input connected to said clock terminal, a second input connected to the output of said at least one adjustable delay cell, and having an output;
   a delay monitor having a first input connected to the output of said exclusive OR gate, and having a second input and an output; and
   a delay controller having an input connected to the output of said delay monitor and an output connected to the delay setting input of said at least one adjustable delay cell and to the second input of said delay monitor.

2. The clock frequency multiplier of claim 1 wherein said delay controller comprises:
   a phase detector having an input connected to the output of said delay monitor, and having an output; and
   a charge pump having an input connected to the output of said phase detector and having an output connected to the delay setting input of said at least one adjustable delay cell.

3. The clock frequency multiplier of claim 2 wherein said delay controller further comprises:
   a low-pass filter having an input connected to the output of said charge pump and having an output; and
   a voltage-to-current converter having an input connected to the output of said low-pass filter and having an output; and
   wherein the output of said voltage-to-current converter is connected in lieu of the output of said charge pump to the delay setting input of said at least one adjustable delay cell.

4. The clock frequency multiplier of claim 3 wherein said delay monitor comprises:
   an adjustable delay cell having a delay setting input connected to the output of said voltage-to-current converter, a clock input connected to the output of said exclusive OR gate, and having an output connected to the input of said phase detector; and
   an inverter having an input connected to the output of said exclusive OR gate and having an output connected to a second input of said phase detector.

5. The clock frequency multiplier of claim 4 wherein:

said delay controller provides a control signal to said at least one adjustable delay cell, for setting the delay of said cell;

said delay monitor receives and processes control signal feedback from the output of said delay controller and a multiplied clock frequency signal from the output of said exclusive OR gate, and provides processed signals to said delay controller; and the control signal to the at least one adjustable delay cell has a magnitude and a polarity such that at a particular input clock frequency, an output multiplied clock frequency signal has a prescribed duty cycle that remains the same with variation of an input clock frequency at said clock terminal.

6. The clock frequency multiplier of claim 5 wherein the prescribed duty cycle is a fifty percent duty cycle.

7. A clock frequency multiplier comprising:

an N-multiplier logic function device wherein N is the number of times that a frequency of an output signal of the clock frequency multiplier, is greater than the frequency of an input clock signal;

N−1 delay devices, wherein:
each delay device has an output connected to an input of said N-multiplier logic function device and to an input of another delay device; and
each delay device, except for one, has the output connected to an input of another delay device; and a delay controller having a first input connected to an output of said N-multiplier logic function device and having an output connected an adjusting delay input of each delay device of said N−1 delay devices, wherein an output signal from said delay controller to each delay device sets the delay of each device so that a duty cycle of the output signal of the clock frequency multiplier is maintained at a prescribed duty cycle.

8. A frequency clock multiplier comprising:

an input terminal;

a first delay cell having a first input connected to said input terminal and having a second input and an output;

a second delay cell having a first input connected to the output of said first delay cell, and having a second input and an output;

a third delay cell having a first input connected to the output of the second delay cell, and having a second input and an output;

a four-input exclusive OR gate having a first input connected to said input terminal, a second input connected to the output of said first delay cell, a third input connected to the output of said second delay cell, a fourth input connected to the output of said third delay cell, and having an output;

a fourth delay cell having a first input connected to the output of said four input exclusive OR gate, and having a second input and an output;

a first buffer having an input connected to the output of said fourth delay cell and having an output;

an inverter having an input connected to the output of said four input exclusive OR gate and having an output;

a phase detector having a first input connected to the output of said inverter, a second input connected to the output of said first buffer, and having first and second outputs;

a charge pump having a first input connected to the first output of said phase detector, having a second input connected to the second output of said phase detector and having an output connected to the second inputs of said first, second, third and fourth delay cells;

a second buffer having an input connected to the output of said four input exclusive OR gate and having an output; and an output terminal connected to the output of said second buffer.

9. The frequency clock multiplier of claim 8 wherein said charge pump and low-pass filter comprise:

a first inverter having an input connected to the first output of said phase detector and having an output;

a second inverter having an input connected to the second output of said phase detector and having an output;

a third inverter having an input connected to the output of said first inverter and having an output;

a first transistor having a first terminal connected to the output of said third inverter, having a second terminal and a third terminal;

a second transistor having a first terminal connected to the output of said second inverter, having a second terminal, and having a third terminal connected to the third terminal of said first transistor;

a first resistor having a first terminal connected to the third terminals of said first and second transistors, and having a second terminal connected to the second inputs of said first, second, third and fourth delay cells;

a second resistor having a first terminal connected to the second terminal of said first resistor, and having a second terminal;

a reference terminal connected to the second terminal of said second transistor;

a capacitor having a first terminal connected to the second terminal of said second transistor and a second terminal connected to said reference terminal; and a voltage source having a first terminal connected to the second terminal of said first transistor and a second terminal connected to said reference terminal.

10. The frequency clock multiplier of claim 9 wherein said phase detector comprises:

a first NAND gate having a first input connected to the output of said inverter, and having a second input and an output;

a second NAND gate having a first input connected to the output of said first buffer;

a third NAND gate having a first input connected to the output of said first NAND gate, and having a second input and an output;

a fourth NAND gate having a first input connected to the output of said third NAND gate, an output connected to the second input of said third NAND gate, and having a second input;

a fifth NAND gate having a first input connected to the second input of said fourth NAND gate, and having a second input and an output;

a sixth NAND gate having a first input connected to the output of said fifth NAND gate, a second input connected to the output of said second NAND gate, and an output connected to the second input of said fifth NAND gate;

a seventh NAND gate having a first input connected to the output of said third NAND gate, a second input connected to the output of said first NAND gate, a third input connected to the output of said second NAND gate, a fourth input connected to the output of said sixth NAND gate, and an output connected to the first input of said fifth NAND gate and to the second input of said fourth NAND gate;

a first inverter having an input connected to the output of said first NAND gate and having an output;

a second inverter having an input connected to the output of said first inverter and having an output;

a third inverter having an input connected to the output of said second NAND gate and having an output;

a fourth inverter having an input connected to the output of said third inverter and having an output;

an eighth NAND gate having a first input connected to the output of said second inverter, a second input connected to the output of said third NAND gate and a third input connected to the output of said seventh NAND gate, and an output connected to the second input of said first NAND gate and to the first input of said charge pump; and a ninth NAND gate having a first input connected to the output of said seventh NAND gate, a second input connected to the output of said sixth NAND gate, a third input connected to the output of said fourth inverter, and an output connected to the second input of said second NAND gate and to the second input of said charge pump.

11. The frequency clock multiplier of claim 10 wherein said four input exclusive OR comprises:

a first two input exclusive OR gate having a first input connected to said input terminal, a second input connected to the output of said first delay cell and having an output;

a second two input exclusive OR gate having a first input connected to the output of said second delay cell, a second input connected to the output of said third delay cell, and having an output;

a third two input exclusive OR gate having a first input connected to the output of said first two input exclusive OR gate, a second input connected to the output of said second two input exclusive OR gate and having an output; and a buffer having an input connected to the output of said third two input exclusive OR gate and an output connected to the first input of said fourth delay cell.

12. The frequency clock multiplier of claim 11 wherein each of said first, second, third and fourth delay cells comprises:

a first input;

a second input;

an output;

a voltage terminal;

a reference terminal;

a first transistor having a first terminal connected to said first input, and having a second terminal and a third terminal;

a second transistor having a first terminal connected to said first input, having a second terminal, and having a third terminal connected to the third terminal of said first transistor;

a third transistor having a first terminal, having a second terminal connected to said voltage terminal, and a third terminal connected to the second terminal of said first transistor;

a fourth transistor having a first terminal, having a second terminal connected to said reference terminal, and a third terminal connected to the second terminal of said second transistor;

a first inverter having an input connected to the third terminals of said first and second transistors, and having an output;

a fifth transistor having a first terminal connected to the output of said first inverter, and having a second terminal and a third terminal;

a sixth transistor having a first terminal connected to the output of said first inverter, having a second terminal, and having a third terminal connected to the third terminal of said fifth transistor;

a seventh transistor having a first terminal connected to the first terminal of said third transistor, a second terminal connected to said voltage terminal, and a third terminal connected to the second terminal of said fifth transistor;

an eighth transistor having a first terminal connected to the first terminal of said fourth transistor, a second terminal connected to said reference terminal, and a third terminal connected to the second terminal of said sixth transistor;

a second inverter having an input connected to the third terminals of said fifth and sixth transistors, and having an output;

a first buffer having an input connected to the output of said second inverter, and an output connected to said output;

a ninth transistor having a first terminal connected to said second input, a second terminal connected to said reference terminal, and having a third terminal;

a tenth transistor having a first terminal, having a second terminal connected to said reference terminal, and a third terminal connected to the third terminal of said ninth transistor;

an eleventh transistor having a first terminal connected to the first terminal of said tenth transistor, a second terminal connected to said reference terminal, and having a third terminal connected to the first terminal of said eleventh transistor;

a first resistor having a first terminal connected to the third terminal of said eleventh transistor and having a second terminal connected to said voltage terminal;

a twelfth transistor having a first terminal connected to the first terminal of said fourth transistor, a second terminal connected to said reference terminal, and a third terminal connected to the first terminal of said twelfth transistor;

a thirteenth transistor having a first terminal connected to the third terminal of said thirteenth transistor, a second terminal connected to said voltage terminal, and a third terminal connected to the third terminal of said tenth transistor; and a fourteenth transistor having a first terminal connected to the first terminals of said third and thirteenth transistors, a second terminal connected to said voltage terminal, and a third terminal connected to the third terminal of said twelfth transistor and to the first terminal of said fourth transistor.

* * * * *

UNITED STATES PATENT AND TRADEMARK OFFICE
CERTIFICATE OF CORRECTION

PATENT NO. : 5,818,270

DATED : October 6, 1998

INVENTOR(S) : Ridha M. Hamza

It is certified that error appears in the above-identified patent and that said Letters Patent is hereby corrected as shown below:

On the Title Page, column 1, line 3, insert

--U.S. Government Rights

The Government may have rights in this invention pursuant to Contract No. DAAL01-94-C-3426, awarded by the Department of the Army.--

Signed and Sealed this

Thirty-first Day of August, 1999

*Attest:*

Q. TODD DICKINSON

*Attesting Officer*       *Acting Commissioner of Patents and Trademarks*